United States Patent [19]

Marchetti et al.

[11] Patent Number: 4,675,350

[45] Date of Patent: Jun. 23, 1987

[54] COMPATIBLE SELF-CROSSLINKING POLY (AMIDE-IMIDE) POLYEPOXIDE RESIN BLENDS AND LAMINATES MADE THEREWITH

[75] Inventors: Joseph R. Marchetti, Hempfield Twp., Westmoreland County; Zal N. Sanjana, Penn Hills, both of Pa.

[73] Assignee: Westinghouse Electric Corp., Pittsburgh, Pa.

[21] Appl. No.: 790,563

[22] Filed: Oct. 23, 1985

Related U.S. Application Data

[63] Continuation-in-part of Ser. No. 670,791, Nov. 13, 1984, abandoned.

[51] Int. Cl.$^4$ .......................... C08L 63/00; C08K 3/22
[52] U.S. Cl. ..................... 523/414; 523/400; 523/453; 523/461; 524/104; 524/173; 524/233; 524/251; 524/500; 524/538; 524/539
[58] Field of Search .............. 523/400, 414, 453, 461; 525/423; 524/173, 104, 233, 251, 500, 538, 539

[56] References Cited

U.S. PATENT DOCUMENTS

| | | | |
|---|---|---|---|
| 3,856,752 | 12/1974 | Bateman et al. | 528/229 |
| 4,252,707 | 2/1981 | Ruid | 524/104 |
| 4,410,664 | 10/1983 | Lee | 525/423 |
| 4,487,911 | 12/1984 | Lange et al. | 524/104 |
| 4,497,922 | 2/1985 | Sato et al. | 524/104 |
| 4,525,507 | 6/1985 | Chaker et al. | 524/233 |

*Primary Examiner*—Lewis T. Jacobs
*Attorney, Agent, or Firm*—R. D. Fuerle

[57] ABSTRACT

Disclosed is a composition comprising about 5 to about 95 phr of a polyepoxide or other resinous component, about 20 to about 90% of an aprotic solvent, about 5 to about 95 phr of a polyimide having sufficient amic acid functionality to be soluble in the solvent, and sufficient water to hydrolyze the polyimide. A laminate is made from the composition by heating it until the amic acid functionality is substantially eliminated, then impregnating a fibrous substrate with the composition, heating the impregnated substrate to evaporate the solvent and B-stage the composition and form a prepreg, forming a stack of the prepregs, and heating and pressing the stack of prepregs to cure the composition. A wire enamel can also be made from the composition.

21 Claims, 2 Drawing Figures

COMPATIBLE SELF-CROSSLINKING POLY (AMIDE-IMIDE) POLYEPOXIDE RESIN BLENDS AND LAMINATES MADE THEREWITH

CROSS-REFERENCE TO RELATED APPLICATION

This application is a continuation-in-part of application Ser. No. 670,791, filed Nov. 13, 1984, now abandoned.

BACKGROUND OF THE INVENTION

Because they are B-stageable and have very good properties, epoxy resins are widely used in making laminates. Laminates have also been made using polyimide-based laminating resins, which have many high performance characteristics not possessed by epoxy resins. However, polyimide resins require more severe curing conditions than do epoxy resins to achieve the optimum properties.

Another approach to improving laminates has been to modify the epoxy resins with imide functional adjuvants. For example, U.S. Pat. No. 4,244,857 teaches the use of certain bis amino imides as curing agents for polyepoxide resins. Similarly, U.S. Pat. No. 3,978,152 discloses thermosetting compositions which are blends of certain unsaturated bisimides with adducts possessing an amino group formed from an epoxy resin and excess amine. U.S. Pat. No. 3,984,373 describes a thermosetting resin composition based on an epoxy resin incorporated with an N,N'-unsaturated amic acid-imide containing compound. Similarly, U.S. Pat. No. 3,979,393 relates to the use of anhydride containing imidyl and isoimidyl compounds as curing agents for polyepoxide resins. In these examples, the imide containing adjuvants are low molecular weight materials which are primarily utilized as polyepoxide hardeners. Therefore, the quantity of imide containing adjuvant blended with the epoxy resin rarely exceeds that amount which is necessary to cure the epoxy resin.

The reason the imides are added as hardeners is that until now it has not been possible to blend or alloy polyimide resins is any quantity with epoxy resins to produce compatible resin blends suitable for laminating applications. For the most part, fully imidized polymers are insoluble in organic solvents, and, while some partially imidized polymers are soluble in organic solvents, the polyimide component is often not soluble in the epoxy component so that a compatible resin blend cannot be formed. In those cases where a blend of epoxy and polyimide resins can be formed which is compatible, very large amounts of organic solvent are required to achieve a blend solution viscosity which is suitable for the manufacture of prepregs. The necessity of evaporating and recovering these large amounts of solvents renders the process uneconomical.

SUMMARY OF THE INVENTION

We have discovered that a particular type of imide oligomer will form a compatible blend with an epoxy resin, and with other types of resins, using a moderate amount of solvent. The imide oligomer of this invention is formed from an imide polymer which contains amic acid groups that can be hydrolyzed so that the products of the hydrolization become compatible with the epoxy or other resin and serve to cure the resinous blend. By incorporating an imide oligomer into the resins, we have been able to achieve laminates having improved properties such as a higher glass transition temperature, better chemical resistance, and increased toughness. Wire enamels having good elongation and heat shock, and fast processing times can also be made from blends containing this imide oligomer. We have also found that a thermoplastic laminate can be made using the imide oligomer by itself.

DESCRIPTION OF THE INVENTION

Figure 1:
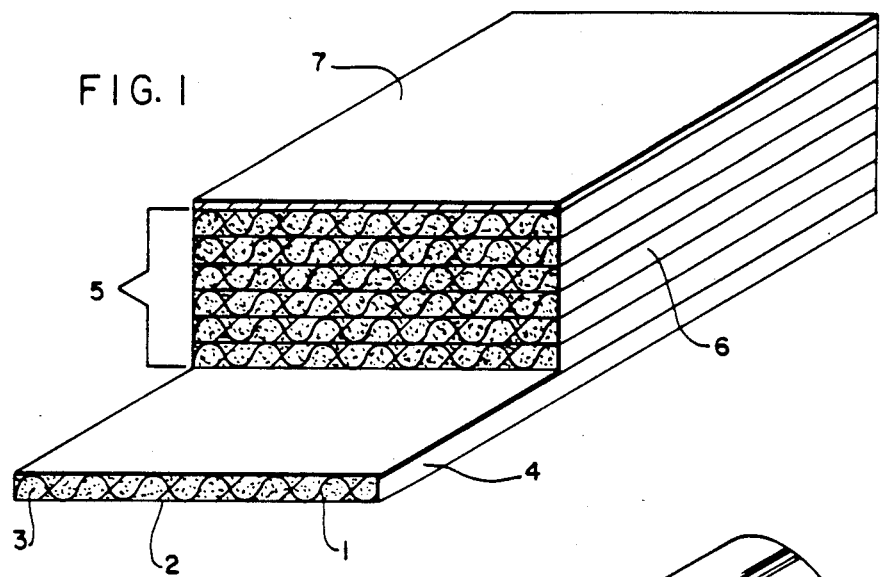
FIG. 1 is an isometric view in section of a certain presently preferred embodiment of a laminate according to this invention.

In the drawing, a layer 1 of a fibrous material 2 is impregnated with a resinous matrix 3 which has been B-staged to form prepregs 4. A stack of prepregs 5 heated under pressure to cure the resinous matrix to the C-stage forms laminate 6. A copper foil 7 has been bonded to one surface of the laminate.

Figure 2:
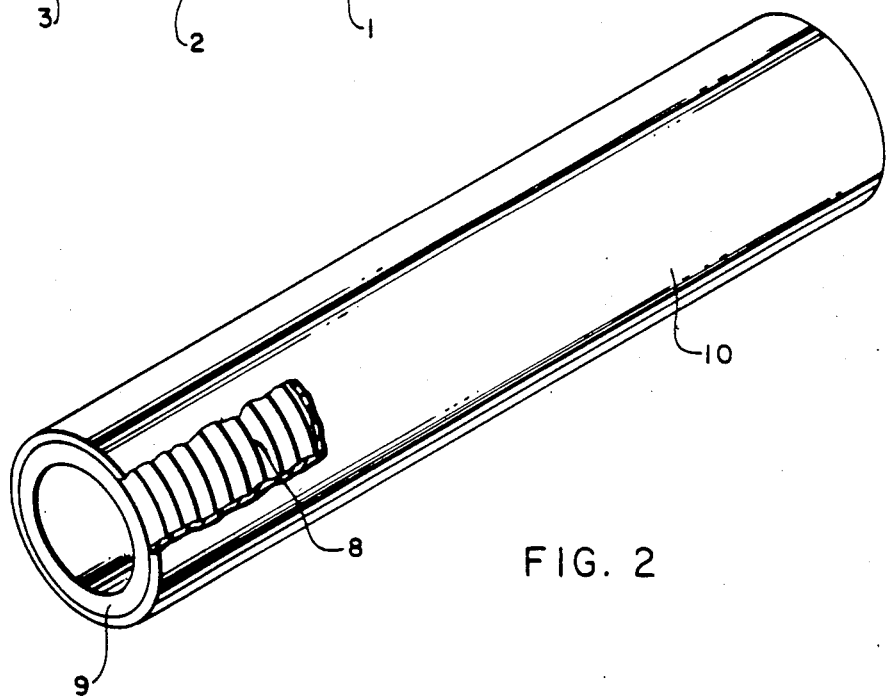
FIG. 2 is an isometric view of a filament wound tube, such as a launch tube, according to this invention, partially cut away.

In FIG. 2, filaments 8, for example, of glass, are wound and imbedded in resinous matrix 9, which has been cured to the C-stage, forming tube 10. Filament wound structures are made by passing roving through a resin bath and over a mandrill, where the resin is cured.

In the first step of preparing a laminate according to the process of this invention, a composition is prepared of a resinous component, (which can be a mixture of resinous components), an imide polymer having amic acid functionality, and a solvent. The resinous component, also called a "coreactive compound," is a monomer, oligomer, or polymer that is reactive with the imide oligomer that is formed by hydrolyzing the imide polymer. Suitable resinous components include bismaleimides and derivatives thereof, polyimides, diols and diacids, diacids and diamines, phenolic resins, capped isocyanates, and polyepoxides. Bismaleimides are formed by reacting maleic anhydride with an aromatic polyamine. The polyamine is a compound having at least two amine groups; preferably, it has exactly two amine groups because those compounds are more readily available. Derivatives of bismaleimides include bismaleimides that have been partially reacted with aromatic diamines or with unsaturated derivatives of bisphenol A. The reaction of the oligomer of this invention with diols and diacids will produce a partially interpenetrating network of a polyester-modified polyamide-imide. The reaction of the oligomer of this invention with diacids and diamines will produce a partially interpenetrating network of a polyamide-imide modified polyamide-imide. Since the reaction of the oligomer of this invention with diols and diacids, diacids and diamines, phenolic resins, and capped isocyanates evolves volatiles, these resin systems are limited to applications such as wire enamels and other coating applications. A polyepoxide is any type of epoxy resin having at least two epoxide groups. It may be cycloaliphatic, novolac, an epoxy prepared from methylene dianiline, an epoxy prepared from para-aminophenol, or a brominated epoxy. The preferred epoxy resins are the diglycidyl ethers of bisphenol A, however, as they are readily available.

The imide polymer which is hydrolyzed to produce the imide oligomer of this invention should have sufficient amic acid groups to be soluble in the solvent. However, if too many amic acid groups are present, the product will have deficient properties, and if too few amic acid groups are present, the polymer will tend to be insoluble. About 5 to about 50% of the total of amic acid plus imide groups along the polymer should be amic acid groups, and 50 to 95% imide groups, as it is the imide groups which enhance the properties of an impregnating resin.

The solvent should be an organic compound which is highly aprotic in order to dissolve the imide polymer. Suitable solvents include N-dimethyl formamide (DMF), N-methyl-2-pyrrolidone (NMP), and dimethyl sulfoxide. The preferred solvent is N-dimethyl acetamide (DMAC) because it is easily removed during B-staging. Mixtures of solvents can also be used. In addition, up to about 5% (all percentages herein are by weight based on total composition weight, unless otherwise indicated) of a hydrocarbon solvent such as xylene, toluene, or Solvesso, can be added to reduce the cost of the solvent. Sufficient water must also be present to hydrolyze substantially all of the amic acid groups in the imide polymer. Typically, the other components in the composition contain sufficient water as an impurity to perform this function, but if they do not, additional water must be added so that at least about the stoichiometric amount required for hydrolysis is present. With some resinous components, it is also possible to hydrolyze the imide polymer prior to its addition to the composition.

The composition comprises about 5 to about 95 phr (parts by weight per hundred parts by weight resin, where "resin" means the resinous component plus the imide polymer, based on total solids) of the imide polymer and about 5 to about 95 phr of the resinous component. Preferably, the composition comprises about 50 to about 80 phr of the resinous component and about 20 to about 50 phr of the imide polymer. The actual ratio of resinous component to imide polymer used is determined by the desired glass transition temperature, since a higher imide content will result in a higher glass transition temperature. The total composition is preferably about 10 to about 80% by weight solids, the remainder being the solvent. The composition may also include about 0.1 to about 0.7 phr of a catalyst, if desired, to shorten the gelation time. Suitable catalysts for polyepoxides and bismaleimides include tertiary amines such as 2-methylimidazole, and benzyl dimethyl amine; the preferred catalyst is 2-methylimidazole (2-MI). Catalysts, if needed, for other resinous components are well known in the art.

Other optional ingredients include about 0.1 to about 25% (based on total solids weight) of a filler such as alumina trihydrate. The filler performs the function of reducing the amount of resin required, which is expensive, and in addition, makes the composition less flammable. A final optional ingredient is about 0.1 to about 5% (based on total solids weight) of a pigment.

In preparing the composition, the resinous component, the imide polymer, the solvent, and the filler and pigment, if used, are cooked until no more amic acid functional groups are present. This can be usually accomplished by heating at about 100° to about 150° C., typically for about a half hour. Of course, the lower temperatures are used for longer times and the higher temperatures are used for shorter times. During hydrolysis, the water present in the composition decomposes the amic acid functional groups to form carboxylic acid and amine groups:

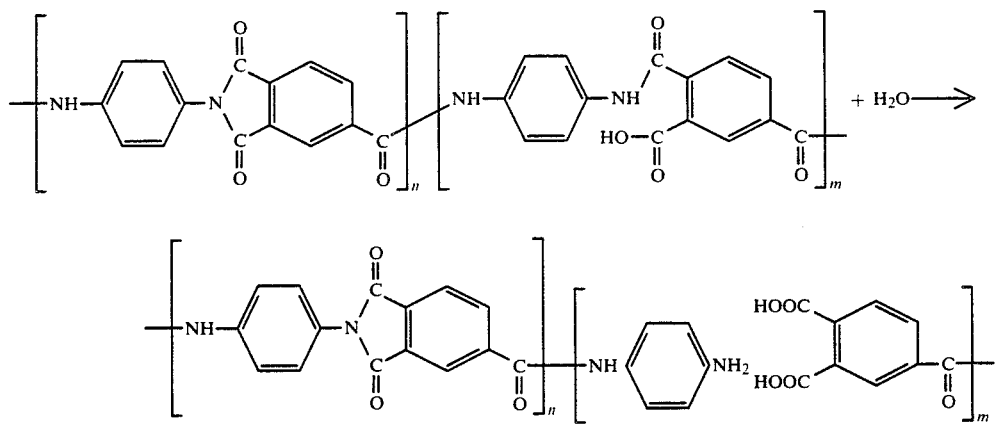

The resulting imide oligomer is an aromatic compound having a molecular weight which depends upon the number of amic acid groups in the imide polymer. The imide oligomer necessarily contains both amine groups and carboxylic acid groups, as a result of the hydrolysis, as well as at least one fully formed imide ring.

The carboxylic acid and amine groups in the imide oligomer then react with groups on the resinous component to form a new polymer containing all three groups. That this occurs is shown by infrared spectrographic analyses of samples of the composition taken at 5 minute intervals as it is being heated. When the resinous component is a polyepoxide, the spectrographic analysis shows the disappearance of both the amic acid peak and the epoxy peak and the growth of a new intermediate peak for the new polymer. Efforts to form the same new polymer by simply mixing the polyepoxide with the original imide polymer were not successful because the two polymers are not compatible and will not dissolve in each other. Nor could the new polymer be formed by first hydrolyzing the imide polymer, then adding the polyepoxide, because the imide portion of the hydrolyzed imide polymer is not soluble in the mixture. After cooling, the optional catalyst can be added if desired. In addition, at this time, additional solvent can be added to reduce the viscosity further, if desired.

In the next step in the process of making a laminate according to this invention, a substrate is impregnated with the composition containing the new polymer. The substrate may be of any fibrous material including glass, cotton, quartz, polyamide, polyaramid, paper, graphite, carbon, or mixtures thereof and may be in many forms including woven cloth, mat, or rovings as used in pultrusion or filament windings. The preferred substrate material is, of course, dependent upon laminate end use. The amount of resin solids impregnated into the substrate depends upon the type of substrate used in the application. Typically, about 20 to about 60% by weight resin solids are impregnated with about 40 to about 80% by weight of the substrate.

In the next step in the process of making a laminate according to this invention, the impregnated substrate is heated to B-stage the resin. The time and temperature required for B-staging depends upon the particular resin used, but generally speaking, the impregnated substrate is heated to the boiling point of the solvent or slightly higher. This results in the evaporation of the solvent and the advance of the resin to the B-stage, the point at which it is non-tacky and can be handled. The resulting article is a prepreg.

In the next step of the process of making a laminate according to this invention, the prepregs are stacked and heated under pressure to form a laminate. Copper foil may be placed on either or both surfaces of the stack to form a laminate suitable for making printed circuit boards. The temperature, time, and pressure used depend upon the materials and the properties desired, but about 150° to about 200° C. for one hour at 1,000 psi is typical.

The composition can also be used to make a wire enamel. In this case, the wire is simply run through the composition after the imide polymer is hydrolyzed, excess composition is removed by dies, wiping or other means, and, in a single step, the composition is cured to the C-stage and the solvents are evaporated. In addition, the composition can be used to make filament wound composite launch tubes, laminates used as components for ship propulsion room equipment, such as sub-base structures, generator covers, and gearcase components, and laminates used as electromagnetic launcher components.

The following is a description of the materials used in the examples:

"Epon 829"—a diglycidyl ether of bisphenol-A made by Shell Chemical Co. by reacting epichlorohydrin with bisphenol-A. In addition to the diglycidyl ether, "Epon 829" contains an unspecified level of a proprietary phosphonium halide catalyst. The material is supplied at 96.5% solids in xylene and contains a maximum 0.03 wt.% hydrolyzable chlorine on an as-is basis.

"Torlon 4000T"—a low acid value, high molecular weight poly(amide-imide) resin containing some amic acid functionality, supplied at 100% solids as a free flowing crumb by the Amoco Chemicals Corporation. The material was developed primarily as a high performance injection molding resin and has the following generalized structure:

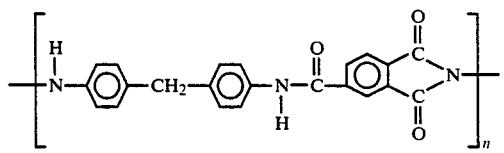

"Tritherm 981"—a poly(amide-imide) wire enamel supplied at 26% total solids in 65/35 (by weight) NMP/xylene by the P. D. George Company.

"MY720"—a Ciba-Geigy high performance, tetrafunctional epoxy resin with the following structure:

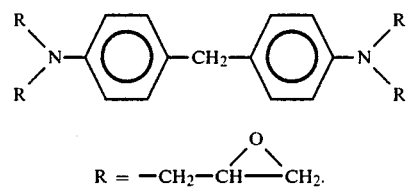

$$R = -CH_2-CH\overset{O}{\diagup\!\!\!\diagdown}CH_2.$$

The material has an epoxide equivalent weight of 125 gm/equiv and is supplied at 100% solids.

"PLYOPHEN 94-308"—a monomeric, aromatic bismaleimide sold by Reichhold Chemicals Corp., made by condensing methylene dianiline and maleic anhydride.

"IM-AD94-394"—a two component polyimide laminating resin sold by Reichhold Chemical Corp. One component is "PLYOPHEN 94-308" and the other is an unsaturated phenolic novolac oligomer.

"COMPIMIDE 183"—a totally aromatic two component polyimide impregnant sold by The Boots Company, PLC, Nottingham, England. It is made by reacting bismaleimides with m-aminobenzoic acid hydrazide at 100% solids.

EXAMPLE 1

The following four resinous reactor products based upon various polyepoxide resin/poly(amide-imide) resin combinations were prepared:

| Resin | A | B | C | D |
|---|---|---|---|---|
| Epoxy Component(s) | "Epon 829" | "MY720"-"Epon 829" | "Epon 829" | "MY720" |
| Poly(Amide-Imide) Component | "Torlon 4000T" | "Torlon 4000T" | "Tritherm 981" | "Torlon 4000T" |

The following is a description of the preparation of these reactor products. A typical charge for the preparation of an "Epon 829"/"Torlon 4000T" resinous reactor product (Resin A) is presented in the following table:

| Material | Function | Weight Charged (gm) | Wt. (gm) NV** | Equiv. | Composition (Wt. %) |
|---|---|---|---|---|---|
| "Epon 829" | Epoxy Resin | 483.3 | 466.4 | 2.48 | 80.0 |
| "Torlon 4000T" | Poly(amide-imide) | 116.6 | 116.6 | — | 20.0 |
| DMAC | Solvent | 349.7 | — | — | — |
| Xylene* | Solvent | (16.9) | — | — | — |
| Total Charge | | 949.6 | 583.0 | 2.48 | 100.0 |

*Not charged separately - "Epon 829" solvent
**Non-volatile.

Dimethyl acetamide (349.7 gm) was charged into a 2,000 ml round bottom, three necked flask fitted with an agitator, nitrogen inlet tube, thermometer, reflux condenser and a means for heating. The flask was swept with $N_2$ gas for 5 minutes and the flow rate adjusted to maintain a slight positive N₂ pressure in the flask throughout the balance of the run.

The agitator was started and the DMAC was slowly heated to 60° C. whereupon neat "Torlon 4000T" (116.6 gm) was slowly added to the hot DMAC at such a rate as to prevent clumping. After the addition of the "Torlon 4000T" was complete, the slurry was heated to 105° C. to effect complete dissolution. The uniform, smooth "Torlon 4000T"/DMAC solution was then cooled to 100° C. and "Epon 829" (483.3 gm/2.48 equiv) was slowly added to the flask over a 5 minute period. After the "Epon 829" addition was complete, a small amount of the reaction mixture was removed for Gel Permeation Chromatographic (GPC) analysis and "Epon 829"/"Torlon 4000T" compatiblity testing. Compatibility testing was accomplished by casting a small amount of material on a glass slide (termed a "pill" in the following log) and driving off the DMAC. A "hazy pill" indicates that "Torlon 4000T" was not soluble in "Epon 829."

After the initial samples had been taken the flask was slowly heated to 140° C. and held there. Sampling was continued during the 140° C. hold and, when a clear pill had been attained, the reaction was cooled and the product set aside for evaluation. The product (Resin A) had a solids content of 61.4% and a viscosity of 420 cps (#2 @ 20 rpm on the Brookfield Model; RVF measured @ 25° C.). The significance of the GPC/IR data and other information obtained during the run will be discussed in a later section of this example.

The following is a log of the preparation of this reactor product.

| Time | Temp. (°C.) | Remarks |
| --- | --- | --- |
| 11:07 | RT | N₂, heat on DMAC, stirrer on |
| 11:10 | 60 | Start "Torlon 4000T" in slowly |
| 11:15 | 95 | "Torlon 4000T" in, hold - H₂O droplets on condenser |
| 11:16 | 105 | Stir, hold temp. until uniform |
| 11:27 | 100 | Solution uniform, begin "Epon 829" addition |
| 11:32 | 63 | "Epon 829" in, heat to 140° C., pill-1, GPC sample-1 |
| 11:38 | 75 | Continue heating |
| 11:44 | 100 | Take pill-2 (hazy), continue heating |
| 11:53 | 120 | GPC sample-2, pill-3 (hazy), continue heating |
| 12:05 | 140 | Hold, GPC sample-3, pill-4 (hazy), viscosity drop |
| 12:20 | 140 | GPC sample-4, pill-5 (hazy), continue heating |
| 12:35 | 140 | GPC sample-5, pill-6 (clear), begin cooling |
| 12:48 | 45 | Continue cooling |
| 12:58 | 35 | Pour/store for evaluation |

The same equipment but slightly different procedures were utilized to prepare Resins B, C, and D. Processing parameters and reactor charges for these materials are presented in the following Tables:

| Reactor Charge For Resin B | | | | | |
| --- | --- | --- | --- | --- | --- |
| Material | Function | Weight Charged (gm) | Wt. (gm) NV | Equiv. | Composition (Wt. %) |
| "Epon 829" | Epoxy Resin | 342.0 | 330.0 | 1.753 | 55.0 |
| "MY720" | Epoxy Resin | 120.0 | 120.0 | 0.960 | 20.0 |
| "Torlon 4000T" | Poly(amide-imide) | 150.0 | 150.0 | — | 25.0 |
| DMAC | Solvent | 388.0 | — | — | — |
| | | 1,000.0 | 600.0 | | 100.0 |

| Processing Parameters For Resin B |
| --- |
| Reaction Temperature - 140° C. |
| Reaction Time @ 140° C. - 0.5 hr |
| Wt. % Solids - 60.0% |
| Viscosity - 1,086 cps (#2 @ 20 rpm) |

| Reactor Charge For Resin C | | | | |
| --- | --- | --- | --- | --- |
| Material | Function | Weight Charged (gm) | Equiv. | Composition (Wt. %) |
| "Epon 829" Solids | Epoxy Resin | 420.0 | 2.23 | 70.0 |
| "Tritherm 981" Solids | Poly(amide imide) | 180.0 | — | 30.0 |
| NMP* | Solvent | 370.5 | — | — |
| Xylene* | Solvent | 214.7 | — | — |
| | | 1,185.2 | | 100.0 |

*Not charged - "Epon 829"/"Tritherm 981" solvents.

| Processing Parameters For Resin C |
| --- |
| Reaction Temperatures - 140° C., 160° C. |
| Reaction Times - 0.5 hr @ 140° C., 0.5 hr. @ 160° C. |
| Wt. % Solids - 50.6% |
| Viscosity - 1,680 cps (#2 @ 20 rpm) |

| Reactor Charge For Resin D | | | | |
| --- | --- | --- | --- | --- |
| Material | Function | Weight Charged (gm) | Equiv. | Composition (Wt. %) |
| "MY720" | Epoxy Resin | 420.0 | 3.36 | 70.0 |
| "Torlon 4000T" | Poly(amide imide) | 180.0 | — | 30.0 |
| DMAC | Solvent | 733.3 | — | — |
| | | 1,333.3 | | 100.0 |

| Processing Parameters For Resin D |
| --- |
| Reaction Temperature - 140° C. |
| Reaction Time @ 140° C. - 0.5 hr |
| Wt. % Solids - 45.0% |
| Viscosity - 1,010 cps (#2 @ 20 rpm) |

Note that a 160° C. processing temperature is required to achieve compatibility between "Epon 829" and "Tritherm 981" in Resin C. Heating is *not* required to achieve compatibility between "MY720" and "Torlon 4000T" (Resin D) for the *specified* composition. However, heating at 140° C. is required to bring about the reduction in viscosity necessary for laminating applications.

Although no examples are provided, tetrabrominated polyepoxides such as Dow's "DER 542," s"DER 521A75," and the like would have utility in the practice of this invention. Similarly, multifunctional epoxy resins other than "MY720" (such as epoxy novolac resins) would have application. In like manner, nondiglycidylether bisphenol-A resins such as Union Carbide's cycloaliphatic epoxy resin line could be utilized in the preparation of the disclosed amide-imide modified laminating resins.

EXAMPLE 2

Compositional data along with varnish properties for a series of laminating varnishes which demonstrate the utility of our disclosure is presented in the table which follows. The varnishes were formulated by charging an appropriate amount of Resin A, B, C, or D into a stainless steel beaker fitted with a propeller type agitator. A catalyst of 2-methylimidazole (0.28 wt.% on total resin solids) was charged and mixed until it had dissolved. Additional solvents, filler, pigments, and/or catalysts and the like could have been added at this stage in the formulation scheme. The varnishes were stirred 15 minutes prior to impregnation onto style 7628 glass cloth.

| Laminate | A | B | C | D |
|---|---|---|---|---|
| Resin | A | B | C | D |
| Wt. % "Epon 829" | 74.77 | 54.83 | 69.80 | — |
| Wt. % "MY720" | — | 19.94 | — | 69.80 |
| Wt. % "Torlon 4000T" | 19.94 | 24.93 | — | 29.92 |
| Wt. % "Tritherm 981" | — | — | 29.90 | — |
| Wt. % 2-MI | 0.29 | 0.29 | 0.30 | 0.28 |
| Impregnating Solids, Wt. % | 61.6 | 53.4 | 51.0 | 45.0 |
| Impregnating Solvents | DMAC | DMAC/Methyl Cellosolve | Xylene/NMP | DMAC/Xylene |
| Varnish Viscosity, cps | 350 | 400 | 1,665 | 1,010 |
| Set-Time, Mins @ 153° C. | 32.8 | 17.0 | 40.4 | 25.1 |

Note that in the above table the individual polyepoxide/poly(amide-imide) resins are presented in terms of composition. As an example, Laminate A contains 74.77% "Epon 829" and 19.94% "Torlon 4000T." The ratio of these numbers corresponds to the composition of Resin A. The same holds true for Laminate B; i.e., the ratio of tabulated "Epon 829"/"MY720"/"Torlon 4000T" corresponds to the composition of Resin B.

Style 7628 glass cloth was utilized to prepare 15"×15" prepregs from the varnishes outlined in the above table. The wet prepregs were B-staged at 160° C. for 10 minutes. After B-staging, the prepregs were approximately 40% resin and 60% glass cloth.

The B-staged prepregs were cut into 7"×7" squares and press laminated by stacking nine (9) individual pieces between steel caul plates with Tedlar mold release sheets between the caul plates and prepreg stack. The molding packs were loaded into a cold press with five layers of kraft paper between the press platens and caul plates. Individual molding packs were then heated to 180° C. under 1,000 psi in 45 minutes with an hour hold at 180° C. Cooldown was accomplished under pressure.

General properties for the laminates are presented in the following table.

| Laminate | A | B | C | D |
|---|---|---|---|---|
| Glass Transition, DSC, °C. | 149.4 | 157.0 | 159.0 | 205.7 |
| Z-Direction* Expansion, In./In./°C. | 60.6 × 10$^{-6}$ | 75.4 × 10$^{-6}$ | 75.1 × 10$^{-6}$ | — |
| Solder Float, Sec. @ 525° F. | 60+ | 60+ | 60+ | 60+ |
| Acetone Resistance | Excellent | Excellent | Excellent | Excellent |
| DMF Resistance | Excellent | Excellent | Excellent | Excellent |

*Z-direction expansion coefficient measured from 40° C. to Tg.

From the data in the above table, it is apparent that a broad range of Tg values can be produced *without* the addition of external crosslinking agents. It is further apparent that the epoxy component as well as the poly(amide-imide) component can influence laminate Tg. Note that the utilization of "MY720" in Laminate B and D results in Tg values higher than the 149.4° C. shown for Laminate A. Laminate C, based upon "Tritherm 981," provides a higher Tg laminate (159.0° C.) than Laminate A, based upon "Torlon 4000T" (149.4° C.).

Laminate samples were placed in uncovered aluminum pans and aged in a vented, forced air oven at 225° C. Weight losses observed during thermal aging are presented in the following table. Note that a production G-10 laminate was also heat aged at 225° C. NEMA grade FR-4 laminate was also aged at 225° C. but delaminated in 24 hours.

| LAMINATE | | | | | | | |
|---|---|---|---|---|---|---|---|
| G-10 | | A Wt. | | B | | C | |
| Hrs @ 225° C. | Wt. % Loss | Hrs @ 225° C. | % Loss | Hrs @ 225° C. | Wt. % Loss | Hrs @ 225° C. | Wt. % Loss |
| 24 | 1.29 | 24 | 0.93 | 24 | 1.06 | 24 | 1.08 |
| 48 | 1.67 | 48 | 1.20 | 48 | 1.44 | 48 | 1.44 |
| 72 | 1.92 | 72 | 1.40 | 72 | 1.69 | 72 | 1.70 |
| 144 | 2.45 | 96 | 1.55 | 96 | 1.89 | 96 | 1.90 |
| 168 | 2.60 | 168 | 1.99 | 168 | 2.39 | 168 | 2.44 |
| 384 | 3.44 | 192 | 2.10 | 192 | 2.53 | 192 | 2.59 |
| 672 | Failed | 216 | 2.22 | 216 | 2.66 | 216 | 2.72 |
| | | 240 | 2.31 | 240 | 2.77 | 240 | 2.83 |
| | | 264 | 2.40 | 264 | 2.86 | 264 | 2.93 |
| | | 336 | 2.65 | 336 | 3.14 | 336 | 3.23 |
| | | 360 | 2.73 | 360 | 3.22 | 360 | 3.32 |
| | | 576 | 3.32 | 576 | 3.80 | 576 | 3.98 |
| | | 864 | 3.85 | 864 | 4.27 | 864 | 4.54 |

Thermal aging at 225° C. for Laminates A, B, and C was continued.
*Resin content = approximately 40%.

After 864 hours at 225° C. all of the polyepoxide/poly(amide-imide) based laminates were blister free and apparently retained their initial high degree of mechanical integrity.

EXAMPLE 3

Preparation of Hydrolyzed "Torlon 4000TF"

A typical charge and accompanying log for the preparation of hydrolyzed "Torlon 4000T" is shown below.

| Material | Wt. Charged (Gm) | Composition, Wt. % |
|---|---|---|
| "Torlon 4000T" | 600.0 | 29.70 |
| DMF | 1,400.0 | 69.31 |
| Deionized H$_2$O | 20.0 | 0.99 |
| | 2,020.0 | 100.00 |

| Time | Temperature (°C.) | Remarks |
|---|---|---|
| 8:15 | RT | Charge DMF/H₂O Into Reactor, Heat/N₂ On |
| 8:20 | RT | Begin Charging T-4000 |
| 8:29 | 58 | All T-4000 Charged |
| 9:00 | 139 | Refluxing-Gardner Vis. = Y @ 24.1° C. |
| 9:30 | 140 | Gardner Viscosity = Q-R |
| 10:00 | 140 | Gardner Viscosity = N-O |
| 10:15 | 140 | Heat off - Cool & Store (Vis. = N-O) |

Dimethyl formamide (1,400.0 gm) and deionized water (20.0 gm) were charged into a 3,000 ml round bottom flask fitted with an agitator, nitrogen inlet tube, thermometer, reflux condenser and a means for heating. The flask was swept with N₂ gas for 5 minutes and the flow rate adjusted to maintain a slight positive N₂ pressure in the flash throughout the balance of the run. The agitator was started and the DMF/H₂O solution heated while the "Torlon 4000T" was added to flask at such a rate as to prevent clumping. After addition of the "Torlon 4000T" (58° C.) the slurry was heated to 140° C. and held until the solution viscosity disposed from Y to N-O. The resulting hydrolyzed product had a solids content of 29.5% solids and was utilized to prepare laminate 211184-42. Further heating would not have led to a further reduction in solution viscosity.

EXAMPLE 4

Preparation of a Laminate from Hydrolyzed "Torlon 4000T"

This example is provided to show that the "Torlon" hydrolysis product is resinous and can be processed utilizing conventional techniques.

A 16½"×49½" swatch of style 7628 fiberglass cloth was continuously impregnated with hydrolyzed "Torlon 4000T" reactor product of Example 3. The wet swatch was then cut into three 16½"×16½" sections and B-staged 7 minutes at 175° C. to produce prepreg with a resin content of 32% by weight. The prepregs were cut into 15½"×7¾" strips and again impregnated with 211184-40. After B-staging 10 minutes at 175° C., the prepregs had a resin content of 50.1% by weight.

A molding pack was constructed by stacking nine each 7"×7" plys of prepreg between two silicone coated fiberglass bleeder plys. The molding pack was placed between steel caul plates and the whole loaded into a cold press with two layers of fiberglass cloth between the press platens and caul plates. The molding pack was then heated to 225° C. under 1,000 psi in one hour with an hour hold at 225° C. Cooldown was accomplished under pressure.

After lamination under the above conditions the resulting laminate was unitary and quite tough. A Tg value of 185° C. was measured via Dynamic Mechanical Analysis (DMA). The evolution of cure volatiles during press lamination was not evident.

A 0.5 square inch section was cut from the laminate and placed into a sample jar containing 50 gms of DMF. After approximately one hour the resin had dissolved, thereby showing that the hydrolyzed "Torlon" remains essentially a thermoplastic after lamination.

EXAMPLE 5

Preparation of Impregnating Resin Based Upon Hydrolyzed "Torlon 4000T" and "Plyophen 94-308"

A typical charge and accompanying log for the preparation of an impregnating resin (211184-32) based upon hydrolyzed Torlon 4000T and Plyophen 94-308 is shown below.

| Material | Wt. (Gm) | Wt. (Gm) NV | Composition, Wt. % |
|---|---|---|---|
| Hydrolyzed "Torlon" (Example 3) | 600.0 | 196.2 | 50.0 |
| "Plyophen 94-308" | 196.2 | 196.2 | 50.0 |
| | 796.2 | 392.4 | 100.0 |

| Time | Temp. (°C.) | Remarks |
|---|---|---|
| 1:30 | RT | N₂, Agitator and Heat On 211082-127 and 94-308 |
| 1:40 | 90 | Reaction Mixture Clear, Δ→ Reflux |
| 1:54 | 142 | Refluxing - Hold. Pill - Hazy |
| 2:10 | 142 | Pill Still Hazy |
| 2:22 | 143 | Pill - Hazy; Δ→ 150° C. |
| 2:55 | 150 | DMF Off, Pill Slightly Hazy |
| 3:02 | 153 | 27.1 gm DMF Off - Continue Heating |
| 3:30 | 153 | Heat Off - Pill Clear - Store Resin For Evaluation |

Hydrolyzed "Torlon 4000T" (600.0 gm) and "Plyophen 94-308" (196.2 gm) were charged into a 2,000 ml round bottom, three necked flask fitted with an agitator, nitrogen inlet tube, thermometer, reflux condenser with Dean-Stark trap and a means for heating. The flask was swept with N₂ gas for five minutes and the flow rate adjusted to maintain a slight positive N₂ pressure in the flask throughout the balance of the run.

The agitator was started and the reaction mixture slowly heated to reflux. Compatibility testing was accomplished by casting a small amount of material on a glass slide (termed a "pill" in the log) and driving off the DMF. A "hazy pill" indicates that "Plyophen 94-308" is not soluble in the hydrolyzed "Torlon 4000T" solids. The reaction mixture was sampled during the 140°-150° C. hold and when a clear pill had been attained, the reaction was cooled and the product set aside for evaluation. The product had a solids content of 51.0%, a viscosity of 460 cps at 90° C. and a gelation time of 45 minutes at 150° C. The product was impregnated without further modification.

EXAMPLE 6

Laminate Preparation

Approximately 400 gm of the impregnant from Example 5 was heated to 90° C. and utilized to impregnate a 16½"×49½" swatch of style 7628 fiberglass cloth. The wet swatch was cut into three 16½"×16½" sections and B-staged 5 minutes at 170° C. to produce prepreg with a 43.3% resin content. A molding pack was constructed by stacking nine each 7"×7" plys of prepreg between two silicone coated fiberglass cloth bleeder plys. The molding pack was placed between steel caul plates and the whole loaded into a cold press with two layers of fiberglass cloth between the press platens and caul plates. The molding pack was heated to 225° C. under 1,000 psi in 1 hour with a 1 hour and 15 minutes hold at 225° C. Cooldown was accomplished under pressure.

The resulting laminate was unitary, DMF resistant and had a Tg of 195° C. as measured by DMA (FIG. 2). A portion of the laminate was post-baked 16 hours at 250° C. Post-baking resulted in a 225° C. Tg as measured via DMA.

EXAMPLE 7

Preparation of Impregnating Varnish Based Upon Hydrolyzed "Torlon 4000T" and "IM-AD 94-394"

An impregnating varnish based upon hydrolyzed "Torlon 4000T" and "IM-AD 94-394" was prepared via a kettling operation. The charge and accompanying log is shown below.

| Material | Wt. (Gm) | Wt. (Gm) NV | Composition, Wt. % |
|---|---|---|---|
| Hydrolyzed Torlon (Example 3) | 291.7 | 87.5 | 25.0 |
| "IM-AD 94-394" | 262.5 | 262.5 | 75.0 |
| DMF | 145.8 | — | — |
|  | 700.0 | 350.0 | 100.0 |

| Time | Temp. (°C.) | Remarks |
|---|---|---|
| 8:20 | RT | Charge - 40 + DMF, Begin IM-AD 94-394 Addition, N₂, Heat On |
| 8:55 | 60 | IM-AD 94-394 Addition Complete |
| 9:06 | 130 | Hold, Pill Taken - Hazy |
| 9:10 | 135 | Mantle Down, Cool to 130 - Pill - Hazy |
| 9:13 | 132 | Mantle Up |
| 9:19 | 130 | Pill - Hazy |
| 9:32 | 134 | Pill - Hazy; Heat Back |
| 9:36 | 130 | Pill Nearly Clear |
| 9:37 | 130 | Gardner Viscosity - Z-1 @ 25.5° C., Transfer to Preparing Trough |

Prepegs and a single nine ply laminate were prepared utilizing techniques described in Examples 3 and 4. The prepregs were staged 4 minutes at 150° C. followed by five additional minutes at 170° C. The resulting prepreg had a resin content of 41.6% and was laminated in a nine ply array under 1,000 psi for 1 hour at 225° C. Cooldown was done under pressure. The resulting laminate was unitary, DMF resistant and had a Tg value of 225° C. measured via DMA. Post bake would have resulted in increased Tg.

EXAMPLE 7

Preparation of Impregnating Varnish Bvased Upon Hydrolyzed "Torlon 4000T" and "Compimide 183"

The resin charge and accompanying log shown below pertains to the preparation of a laminating composition based upon hydrolyzed "Torlon 4000T" and "Compimide 183."

| Material | Wt. (Gm) | Wt. (Gm) NV | Composition, Wt. % |
|---|---|---|---|
| "Compimide 183" (Example 3) | 225.0 | 225.0 | 75.0 |
| Hydrolyzed 4000T | 250.0 | 75.0 | 25.0 |
| DMF | 125.0 | — | — |
|  | 600.0 | 300.0 | 100.0 |

| Time | Temp. (°C.) | Remarks |
|---|---|---|
| 8:45 | RT | Charge - 40 + DMF; Heat, N₂ On; Start 183 Addition |
| 8:50 | 50 | "Compimide 183" Addition Complete |
| 8:54 | 80 | 183 Dissolved, Δ→ 130° C. |
| 9:02 | 130 | Hold - Pill Taken, Slightly Hazy |
| 9:17 | 129 | Slightly Hazy Pill |
| 9:26 | 129 | Gardner Viscosity - M to N (330 cps @ 25° C.) |
| 9:41 | 130 | Viscosity M-N |
| 9:52 | 129 | Heat Off, Cool - Hold For Evaluation |

Prepreging and laminating techniques previously described were utilized with this resin. The resin was impregnated at 40° C. and staged 3 minutes at 150° C. followed by 4 additional minutes B-stage time at 170° C. The resulting prepreg had a resin content of 38.0% and was laminated in a nine ply array of 225° C. for 1 hour under 1,000 psi pressure. Cooldown was accomplished under pressure. The resulting laminate was unitary, well cured, DMF resistant and had a Tg of 212° C. via DMA.

EXAMPLE 8

A varnish was prepared of the following composition.

| Material | Wt. (Gm) | Wt. (Gm) NV | Composition, Wt. % |
|---|---|---|---|
| Hydrolyzed "Torlon 4000" (Example 3) | 300.0 | 90.0 | 74.91 |
| Epon 829 | 31.09 | 30.0 | 24.97 |
| 2-MI | 0.14 | 0.14 | 0.12 |
|  | 333.23 | 120.14 | 100.00 |

The varnish was submitted for evaluation as an overcoat for current low cost polyester coated wire and was indicted in a pilot wire tower. The varnish had fast processing characteristics, and the coating exhibited good elongation and heat shock characteristics. The following table gives the results of some of these experiments.

|  | Sample A | Sample B |
|---|---|---|
| Tower Speed (Ft/min.) | 28 | 32 |
| Quick Jerk | Passed | Passed |
| Elongation + 1 × (%) | Passed | Passed |
| Electric Stress (KV) | 7.0–8.0 | 6.5–8.3 |
| 1 × heat shock |  |  |
| 200° C. | Passed | Passed |
| 220° C. | Passed | Passed |
| 240° C. | Passed | Passed |
| 260° C. | Passed | Passed |

We claim:
1. A composition comprising
(A) a solution in an aprotic solvent of about 5 to about 95 phr of a polyimide having both a first functionality that is imide and a second functionality selected from the group consisting of amic acid functionality, hydrolyzed amic acid functionality, and mixtures thereof, where said second functionality is about 5 to about 50% of the total of said first and second functionalities, and a sufficient amount of said second functionality is present to solubilize said polyimide;

(B) sufficient water to hydrolyze any amic acid functionality present on said polyimide; and (C) about 5 to about 95 phr of a coreactive compound that will react with said polyimide, where said coreactive compound is selected from the group consisting of monomers, polymers, and mixtures thereof.

2. A composition according to claim 1 wherein the concentration of said aprotic solvent is about 20 to about 90%.

3. A composition according to claim 1 wherein said solvent is selected from the group consisting of dimethyl formamide; dimethylamine, N-methyl pyrrolidinone, dimethylsulfoxide, and mixtures thereof.

4. A composition according to claim 1 which includes about 0.1 to about 5% of a hydrocarbon solvent.

5. A composition according to claim 1 which includes about 0.1 to about 25% based on solids of a filler.

6. A composition according to claim 5 wherein said filler is alumina trihydrate.

7. A composition according to claim 1 which includes about 0.1 to about 5% based on solids of a pigment.

8. A composition according to claim 1 which includes about 0.1 to about 0.7 phr of a catalyst.

9. A composition according to claim 8 wherein said catalyst is 2-methylimidazole.

10. A composition according to claim 1 wherein said coreactive compound is about 50 to about 80 phr and said polyimide is about 20 to about 50 phr.

11. A composition according to claim 1 wherein said coreactive compound is selected from the group consisting of polyepoxides, polyimides, diols, diacids, diamines, phenolic resins, capped isocyanates, and mixtures thereof.

12. A composition according to claim 11 wherein said coreactive compound is a polyepoxide.

13. A composition according to claim 12 wherein said polyepoxide is a diglycidyl ether of bisphenol A.

14. A composition comprising:

(A) a solution in a solvent of about 5 to about 95 phr of a polyepoxide;

(B) about 5 to about 95 phr of a polyimide having sufficient functionality selected from the group consisting of amic acid, hydrolyzed amic acid, and mixtures thereof to be soluble in said solvent, where said functionality is about 5 to about 50% of the total of said functionality plus imide functionality in said polyimide; and (C) sufficient water to hydrolyze all of said amic acid functionality of said polyimide.

15. A composition according to claim 14 wherein said amic acid functionality is substantially fully hydrolyzed by said water.

16. A composition comprising a solution of about 5 to about 95% of the reaction product of an oligomer, which is the reaction product of water and the amic acid groups of a polyimide, where said amic acid groups are about 5 to about 50% of the total of amic acid plus imide groups in said polyimide, and about 5 to about 95% of a coreactive compound selected from the group consisting of monomers, polymers, and mixtures thereof.

17. A composition according to claim 16 wherein said coreactive compound is a polyepoxide.

18. A B-staged prepreg comprising a substrate imbedded within a resinous matrix which comprised, before B-staging;

(A) about 5 to about 95 phr of a polyepoxide;

(B) about 20 to about 90% aprotic solvent;

(C) about 5 to about 95 phr of a polyimide having sufficient amic acid functionality to be soluble in said solvent; and (D) sufficient water to hydrolyze substantially all of said amic acid functionality of said polymer.

19. A B-staged prepreg according to claim 18 wherein said substrate is fibrous material selected from the group consisting of glass, cotton, quartz, polyamide, paper, carbon, and mixtures thereof.

20. A composition according to claim 1 wherein said second functionality is amic acid functionality.

21. A composition according to claim 1 wherein said second functionality is hydrolyzed amic acid functionality.

* * * * *